(12) United States Patent
Li et al.

(10) Patent No.: US 7,737,636 B2
(45) Date of Patent: Jun. 15, 2010

(54) LED ASSEMBLY WITH AN LED AND ADJACENT LENS AND METHOD OF MAKING SAME

(75) Inventors: Yi-Qun Li, Danville, CA (US); Yi Dong, Tracy, CA (US); Wei Shan, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 11/800,977

(22) Filed: May 7, 2007

(65) Prior Publication Data

US 2008/0111141 A1    May 15, 2008

Related U.S. Application Data

(60) Provisional application No. 60/858,211, filed on Nov. 9, 2006.

(51) Int. Cl.
    *H01J 1/62* (2006.01)
(52) U.S. Cl. .................................. 313/512; 313/498
(58) Field of Classification Search ............. 313/512; 362/545
    See application file for complete search history.

(56) References Cited

U.S. PATENT DOCUMENTS

| 6,791,259 B1* | 9/2004 | Stokes et al. .......... 313/503 |
| 2003/0156425 A1* | 8/2003 | Turnbull et al. ........ 362/545 |
| 2008/0061458 A1 | 3/2008 | Park et al. |

OTHER PUBLICATIONS

International Search Report for PCT/US07/11187 dated Aug. 25, 2008, 11 pages.

* cited by examiner

*Primary Examiner*—Joseph L Williams
(74) *Attorney, Agent, or Firm*—Fliesler Meyer LLP (57) ABSTRACT

An LED assembly having an LED and a lens disposed adjacent to a light emitting surface of the LED. The area of cross-section of the lens projected onto the light emitting surface of the LED is substantially equal to or less than the area of the LED's light emitting surface. The light emitting device can comprise an array of LEDs and an array of lenses, in which at least one lens is associated with each member of the LED array and wherein the area of a cross-section of each lens projected onto the light emitting surface of its associated LED is substantially equal to or less than the area of the LED's light emitting surface.

34 Claims, 6 Drawing Sheets

LED ASSEMBLY WITH AN LED AND ADJACENT LENS AND METHOD OF MAKING SAME

CROSS REFERENCE TO RELATED APPLICATIONS

This application claims priority to U.S. Provisional Application Ser. No. 60/858,211 filed Nov. 9, 2006 entitled "Light Emitting Diode Lens Assembly and Arrays thereof with Phosphor Enhancement" which is incorporated by reference herein in its entirety.

BACKGROUND OF THE INVENTION

1. Field of the Invention

The present invention relates to light emitting devices comprising light emitting diode (LED) assemblies and LED array assemblies and methods of fabrication thereof. More especially, the invention concerns LED lens assemblies and LED array lens assemblies. Moreover, although not exclusively, the invention concerns LED assemblies with phosphor enhancement.

2. Description of the Related Art

Achieving the brightness expected from today's light emitting diodes (LEDs) requires efficiently extracting the light generated by the LED chip/die. LED chips typically have either an edge-emitting or surface-emitting structure. Total internal reflection is the major loss mechanism that reduces the proportion of emitted photons and as is known the total internal reflection of photons incident to surface at angles greater than a critical angle $\theta_c$ defined by Snell's law:

$$\theta_c = \sin^{-1}(n_0/n_1)$$

where $n_0$ and $n_1$ are respectively the indices of refraction for air and LED chip material. In addition absorption within the LED material and Fresnel reflection loss at the interface reduce the light output efficiency of the LED. The total efficiency for electrical to optical conversion in a flat-surface LED is given by [W. N. Carr and G. E. Pittman, Appl. Phys. Lett. 3, 173(1963)]:

$$\eta_F \approx \frac{4n_0 n_1}{(n_0 + n_1)^2}(1 - \cos\theta_C)$$

where $4 n_0 n_1/(n_0+n_1)^2$ is the transmission coefficient and $(1-\cos\theta_c)$ is the solid cone.

To increase extraction efficiency, a stepwise reduction in the index of refraction from the chip to air may be employed to reduce the total internal reflection loss. For example if a medium with an intermediate index of refraction $n_2 = \sqrt{n_0 n_1}$ is used to encapsulate the LED chip, then the critical angle between LED chip and medium is increased to $\theta_c = \sin^{-1}(\sqrt{n_0/n_1})$, resulting in a factor of $(n_2/n_0)^2 = n_1/n_0$ increase in the extraction efficiency relative to air plus some additional correction for Fresnel reflection losses.

Other techniques have been used to increase extraction efficiency. For example roughing the LED chip surface is used to effectively enlarge the surface area of the chip and to thereby ensure that more rays of emitted light fall within the critical angle zone provided by the effectively enlarged surface area. Another technique involves using a photonic crystal to couple as many modes of the emitted light as possible, especially those in the lower orders, out of the top surface of an LED chip.

In addition, optical components such as convex lens are commonly used to alter the emitted radiation pattern of an LED chip to collimate its emission to a desired direction and enhance the brightness of the illumination in that direction. Commonly the lens is surface mounted on an individual LED chip. Moreover, a surface mounted lens made of glass or a plastics material also enhances light extraction since its index of refraction is lower than that of chip material and greater than that of air. In addition, its convexly curved surface considerably increases the size of critical angle zone between the lens and air which assists in extracting more amount of light from the underlying chip. A problem with mounting such lenses is that due to the size of the LED chip, which is typically a few microns, the tolerances for aligning the lens with the chip are very precise and the process can become expensive. For this reason the LED chip or a number of chips are often mounted within a container and the lens mounted to the container.

The recent development of white LEDs based on an InGaN (indium gallium nitride) blue LED chip and various yellow phosphors (photo-luminescent materials) to make an LED that emits light which appears white in color to the eye have made possible many technological and commercial applications including solid state lighting. At present particles of the phosphor material are incorporated in an encapsulating material which is then applied to individual LED chips, which have been diced and packaged. Following the application of the phosphor the lens is surface mounted to the encapsulating phosphor layer. Such a fabrication technique is inefficient, time consuming and expensive.

The inventors have appreciated that the application of phosphor material directly onto the surface of, or embedding it inside, a lens or some other such optical components could simplify the manufacturing process and may in the case of a white LED achieve a better white light uniformity. However, individually packaging phosphor materials along with lenses at discrete chip level is still a time-consuming process.

A need exists therefore an improved method of fabricating LED lens assemblies which can incorporate phosphor enhancement at a wafer level in order to maintain manufacturing quality consistency, improve packaged chip performance, and achieve higher yield rates.

SUMMARY OF THE INVENTION

Disclosed in this patent are methods that provide integrated solutions to achieve efficient light extraction, excellent luminescence conversion and color mixing, directional illumination, and enhancement of brightness and uniformity for LED chips with phosphor coating and optical component mounting at LED wafer level. The optical component may be a lens array with a phosphor coating or embedded phosphor particles. The process of applying the lens array and phosphors may be by lithographic method directly to LED wafers. The structures and processes disclosed in this patent can significantly improve production consistency and manufacturing cost efficiency. The application of an optical lens arrays applied can significantly improve light extraction and light luminescent conversion performance, and significantly improve the manufacturing quality consistency.

According to the invention an LED assembly comprises: an LED and a lens disposed adjacent to a light emitting surface of the LED; wherein the area of a cross-section of the lens projected onto the light emitting surface of the LED is substantially equal to or less than the area of the LED's light emitting surface. The LED assembly can further comprise a phosphor encapsulated within a transparent material, the transparent material surrounding at least a portion of the light emitting surface of the LED. Alternatively, a phosphor layer is disposed between the lens and at least a portion of the LED's light emitting surface.

In one arrangement at least two lenses are disposed adjacent to a light emitting surface of an LED and the sum of the areas of the cross-sections of the at least two lenses projected onto the light emitting surface of the LED is substantially equal to or less than the area of the LED's light emitting surface. The LED assembly can further comprise a phosphor encapsulated within a transparent material, the transparent material surrounding at least a portion of the light emitting surface of the LED. Alternatively, a phosphor layer is disposed between the at least two lenses and at least a portion of the LED's light emitting surface.

According to the invention a light emitting device comprises: an array of LEDs and an array of lenses, wherein there is at least one lens associated with each member of the LED array and wherein the area of a cross-section of each lens projected onto the light emitting surface of the its associated LED is substantially equal to or less than the area of the LED's light emitting surface. The light emitting device can further comprise a phosphor encapsulated within a transparent material, the transparent material surrounding at least a portion of the lens array. Alternatively, a phosphor layer disposed between at least one of the lenses of the lens array and at least one of the LEDs of the LED array.

According to a further embodiment a photonic device comprises: an LED configured to emit radiation at a first wavelength from a light emitting surface; a lens configured to optically focus radiation from the LED; a phosphor positioned adjacent to the LED, the phosphor configured to absorb at least a portion of the radiation emitted by the LED and emit radiation at a second wavelength, wherein the area of a cross-section of the lens projected onto the light emitting surface of the LED is substantially equal to or less than the area of the LED's light emitting surface. In one arrangement the phosphor is encapsulated within a transparent material, the transparent material surrounding at least a portion of a light emitting surface of the LED. Alternatively, the phosphor is disposed as a layer between the lens and at least a portion of the LED's light emitting surface.

According to a further aspect of the invention a method of fabricating an LED assembly comprises: a) dispensing a transparent lens material onto a substrate containing an LED array; and b) molding the transparent lens material into a desired pattern of lenses to match the pattern of the LED array. Depending on the transparent lens material the method can further comprises curing the transparent lens material by for example UV curing or thermal curing prior to removing a mold/stamp used to mold the pattern of lenses. Preferably, the method further comprises removing selected regions of the transparent lens material to provide electrical access to electrodes of the LED array. The selected regions of the transparent lens material can be removed by etching, oxygen plasma etching or wet etching.

In one arrangement the method further comprises depositing a phosphor layer over substantially the entire surface of the LED array substrate prior the dispensing the transparent lens material onto the LED array substrate. Advantageously, the method further comprises providing a release agent overlying electrode regions of the LED array prior to depositing the phosphor. The release agent can then be processed and a lift-off step used to remove selected regions of the phosphor layer and transparent lens material to provide electrical access to electrode regions of the LED array.

Alternatively, the method can further comprise embedding the molded lens material and LED array into a transparent matrix containing a phosphor. Alternatively, the method comprises depositing a phosphor layer between the lens array layer and the LED array substrate.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Disclosed herein are methods of making a device comprising a LED chip and associated lens with or without phosphor material for color mixing and luminescence conversion in volume at wafer level. A lens array may be positioned adjacent to an array of LED dies processed on a substrate referred to as an LED wafer, wherein there is a correspondence between the individual lenses of the lens array and the individual LED dies on the wafer. The lens array may be fabricated using lithographic techniques including molding, casting, and imprinting. The array of LED dies on the wafer may exclusively be GaN (gallium nitride) based LEDs. In the context of this patent application light emitting diode (LED) is to be construed as meaning any solid-state light source and can include for example laser diodes.

LED Assemblies and Arrays

Figure 1:
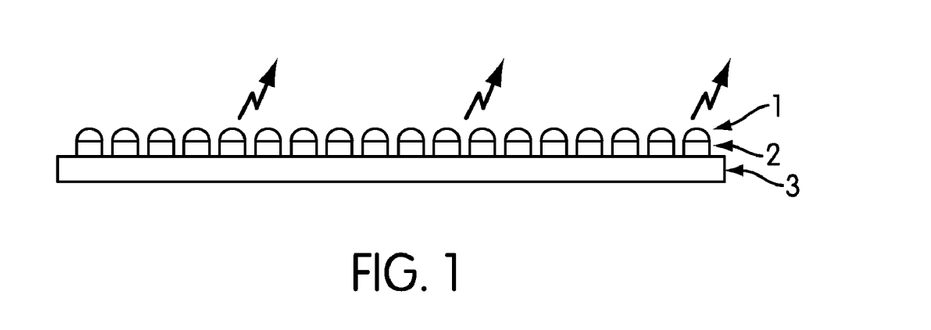
FIG. 1 is a schematic illustration of a method in accordance with the invention for applying a lens array to an array of LED dies on a wafer.

In one embodiment of the invention, the individual elements (lenses) of the lens array may have the dimensions which substantially match the size of the LED dies on an LED wafer, more particularly each array element comprises a single lens whose area of cross-section projected onto the light emitting surface of the corresponding LED die is substantially equal to the area of the LED's light emitting surface. In such an arrangement the lenses and the chips are paired in a one-to-one manner. Alternatively the dimension of the individual lenses in the lens array may be larger than the perimeter of the corresponding die on the LED wafer. They may also spatially match to each other so that the lenses may range from ~50 μm to ~5 mm in size. This one-to-one matching of an element of the lens array to an LED die of the LED array is depicted in FIG. 1.

In this configuration, the array of lenses 1 is attached directly to the array of LEDs 2 the latter of which is formed on a substrate (wafer) 3. The lens array may be made from a variety of materials including silicone, epoxy, polymer, glass or plastics materials. The selection of material can be made dependent on the specific requirement for light extraction and a material with an appropriate index of refraction accordingly selected. The lenses 1 can for example be circular, square, rectangular, hexagonal or any other shape depending on an intended application. In addition to improving radiometric efficiency in illumination, the lenses 1 increase light extraction efficiency since the lenses are mounted on the LED chips they function as an optical medium with an intermediate index of refraction. Preferably each lens has a convexly curved surface which substantially reduces the angle of incidence for a greater proportion of light rays incident on the lens air interface that would otherwise be lost due to total internal reflection were the outer surface relative to air be flat. It will be appreciated that significantly more light can be extracted using a single convex lens mounted on an LED chip.

Figure 2:
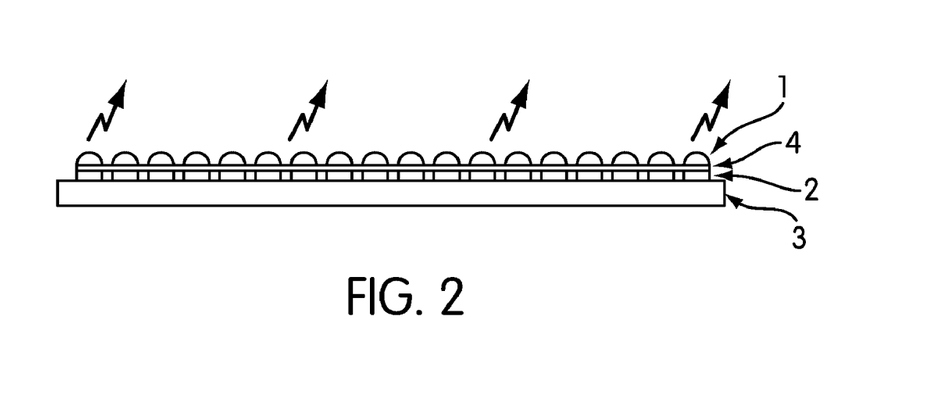
FIG. 2 is a schematic illustration of a lens array and a phosphor coating layer, where the lens array has been configured such that there is one lens assigned to each LED die, and where the LED array has been fabricated on a wafer.

In another embodiment, as illustrated in FIG. 2, a layer of phosphor (photo luminescent) material 4 can be uniformly coated on the LED wafer 3 prior to mounting the lens array 2. The phosphor coating 3 can be patterned so as to leave electrode contact windows open for each individual LED 2 die on the wafer 3. The chemical compositions of the phosphor material may be configured to strongly absorb the photons emitted by the LEDs 2 on which the layer is coated, and to then re-emit light of a longer wavelength. The thickness of the phosphor layer may be optimized to have a desired absorption of the LED emitted light by controlling the coating process. The choice of the phosphor material may be determined based on the wavelength range of its emission band, and the wavelength of the LED emission with which the phosphor emission is to be complementary in terms of color mixing. The phosphor material is conveniently incorporated in a binder material and the composition then applied to the LED chips by any suitable coating process.

The lens array 1 may then be incorporated on top of the patterned phosphor layer 4 using lithographic methods as is described below. The individual lenses 1 of the lens array may have a dimension substantially larger than or matching the size of the LED dies on the LED wafer. The lenses and the chips can be paired in a one-to-one manner. Thus, the dimension of the lenses in the lens array and the perimeter of the dies on the LED wafer spatially matched so that the lenses have dimensions in a range ~50 μm to ~5 mm in size. An advantage of present embodiment is that the lens array can be processed on the LED wafer with phosphor coating in exactly the same way as that used in the embodiment of FIG. 1. As with the embodiment of FIG. 1 the lenses may be circular, square, rectangular, or hexagonal depending on the geometrical configuration of the LED chips. The material of lens array may be silicone, epoxy, polymer, glass or a plastic material. The index of refraction of the lenses of the lens array should be selected to be smaller than that of phosphor to ensure a step-wise reduction of index of refraction from the LED material to phosphor to lens to air ($n_{LED} > n_{Phosphor} > n_{Lens} > n_0$) for enhanced light extraction. Moreover, the convexly curved surface of the lenses substantially increases the number of rays of light falling within the critical-angle zone from the lens to air ensuring a much greater amount of light can be extracted as compared to that which can be extracted with a flat surface relative to air.

Figure 3:
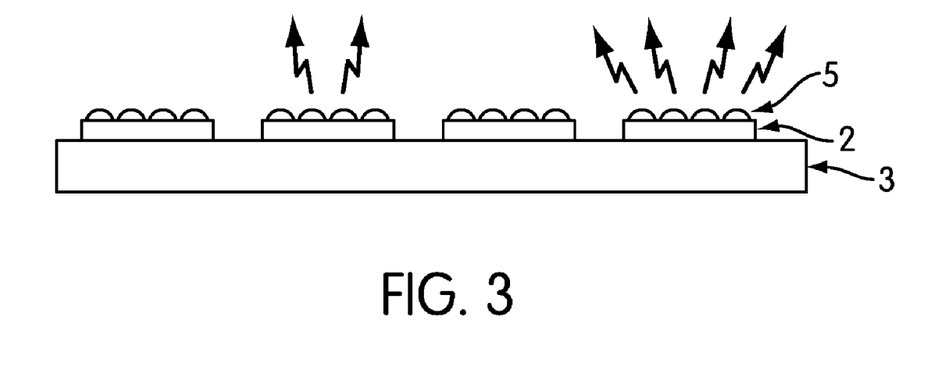
FIG. 3 illustrates an alternative configuration of a lens array in which multiple lenses are provided on each LED die.
Figure 4:
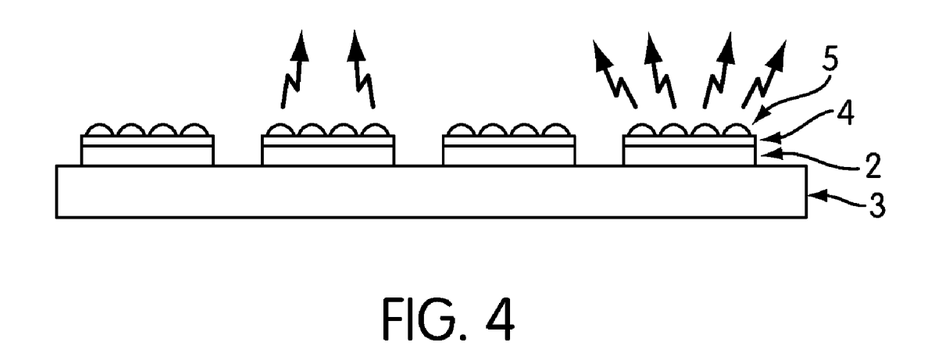
FIG. 4 is an illustration of a configuration similar to that of FIG. 3 and further including a phosphor coating with each set of lenses.

In a further embodiment, as illustrated in FIG. 3, the lens array can be processed such that each array element associated with an LED chip 2 comprises of a plurality of smaller lenses or lenslets 5. Typically each lenslet has dimensions ranging from ~10 nm to 100 μm. The lens array is configured such that one, more or all of the LED dies 2 on the wafer 3 has an array of lenslets 4 mounted on top of it, the array of lenslets covering at least the light emitting area of the LED chip and each LED chip can have between 4 and hundreds or even thousands of lenslets mounted on its light emitting surface. In such an arrangement the sum of the areas of the cross-sections of the lenslets projected onto the light emitting surface of the LED is substantially equal to or less than the area of the LED's light emitting surface. FIGS. 3 and 4 illustrate schemes of integrating lens arrays with the LED wafers without and with a phosphor coating layer 4, respectively. In addition to the advantages of preceding embodiments, this scheme of utilizing a plurality of smaller lenslets can further enhance the light extraction because the multiple lenslets provide a plurality of curved surfaces that randomize the beam paths for the light rays coupling from lens array to air in an analogous manner to that of a roughened surface enhances light extraction. Furthermore, a plurality of smaller lenslets can also improve the uniformity of brightness of the illumination from the LED assembly because of its improved form factor as a result of the large number of lenslets.

Methods of Fabricating LED Assemblies and Arrays

Figure 5A:
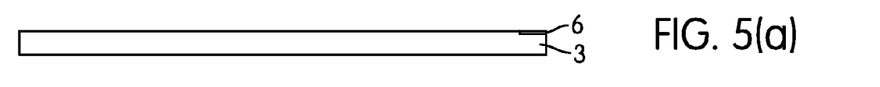
FIGS. 5(a) to 5(g) illustrate steps for molding an array of lenses on top of an array of LEDs in accordance with a method of the invention.

An exemplary method of producing the present LED lens assemblies is illustrated in FIG. 5(a) to 5(g). In this example the lens array is matched to an array of LED dies on a wafer with no intervening phosphor layer between the two arrays. One method that may be used to produce the lens array on or over the LED array on the wafer is a lithographic imprinting method. FIG. 5(a) illustrates an LED wafer 3 with one or more electrode regions 6. It is to be noted that individual LEDs of the LED array are not shown in FIG. 5.

Figure 5B:
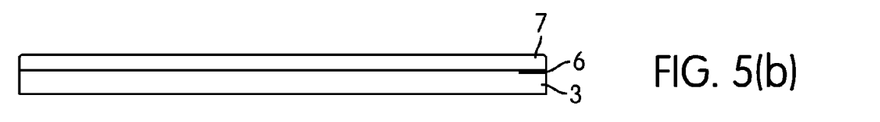
Figure 5C:
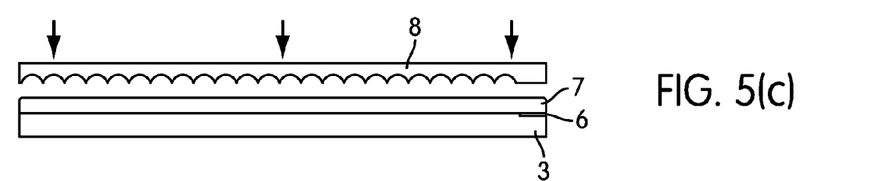
Figure 5D:
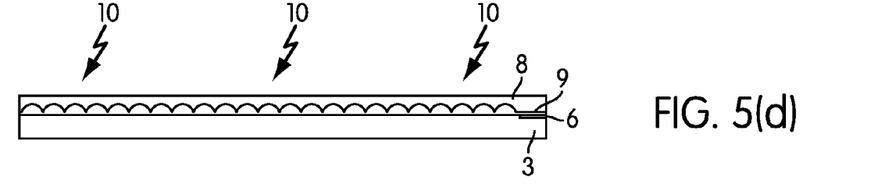
Figure 5E:
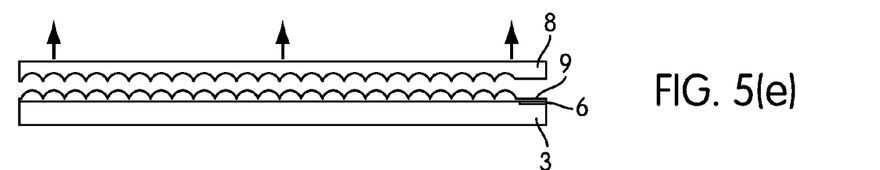

The method comprises the following steps:

Step 1—FIG. 5(b): a transparent lens material 7 is coated or otherwise dispensed onto the LED wafer 3. The transparent lens material 7 can be a silicone, an epoxy, a polymer, a glass, a plastics material, or a mixture thereof;

Step 2—FIGS. 5(c) and 5(d): applying a stamp 8 having a pattern designed to mold the lenses from the transparent lens material to the transparent lens material 7 to conform the material to the shape of the stamp 8. In the embodiment illustrated there is one lens corresponding to each LED die of the LED wafer. The stamp 8 is also configured to provide an electrode window pattern 9 to allow subsequent electrical access to the one or more electrodes 6 of the LED array;

Step 3—FIG. 5(d): exposing the lens material to UV radiation 10 or thermal heat treatment to cure the patterned lens array and electrode window (this step is optional and depends upon the lens material being used). To enable the lens material to be exposed to UV the stamp 8 is advantageously made of a material which is transparent to UV radiation;

Step 4—FIG. 5(e): removing the stamp 8; and

Figure 5F:
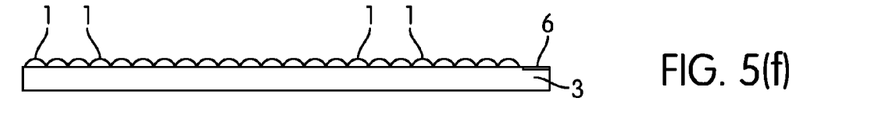
Figure 5G:
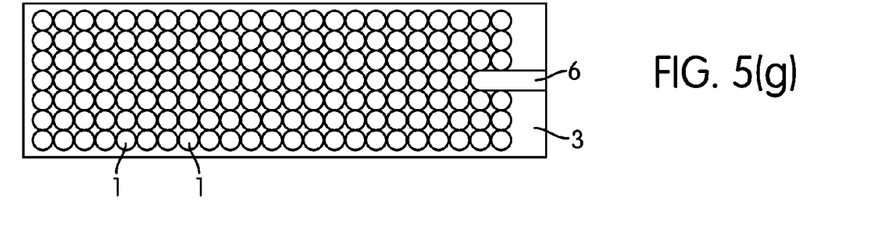

Step 5—FIG. 5(f): exposing selected regions 9 of the transparent material to an etch, such as an oxygen plasma or wet etch, to ash residual silicon or epoxy lens material, and/or to provide electrical access to the electrodes 6 needed to power and control the LEDs. FIG. 5(g) is a plan view illustrating the completed LED lens assembly.

Figure 6A:
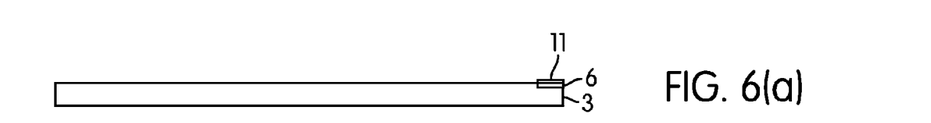
FIGS. 6(a) to 6(h) illustrates steps of a fabrication method similar to that illustrated in FIG. 5 and further including depositing a phosphor layer between the lens array and the LED array.

An exemplary method of producing a lens array matched to an LED array with an intervening phosphor layer between the two arrays is shown in FIGS. 6(a) to 6(h), again using an imprinting lithography technique. FIG. 6(a) illustrates an LED wafer 3 with one or more electrode regions 6. It is to be noted that individual LEDs of the LED array are not shown in FIG. 6.

Figure 6B:
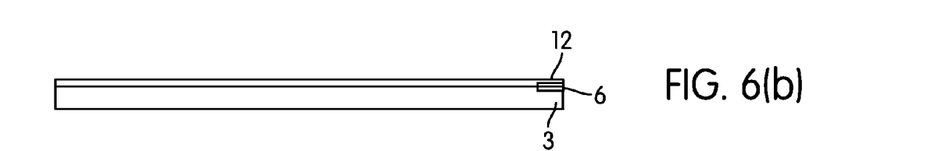
Figure 6C:
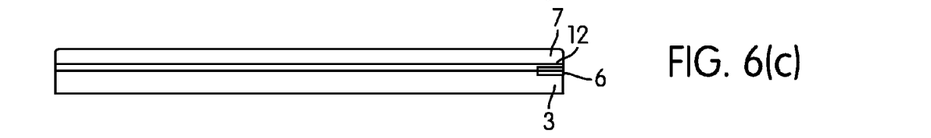
Figure 6D:
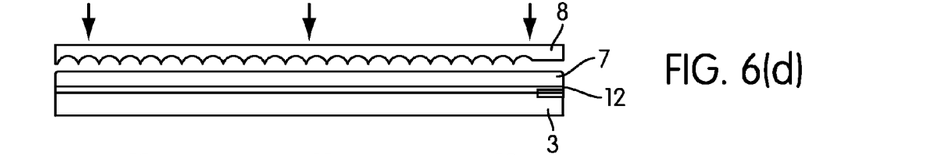
Figure 6E:
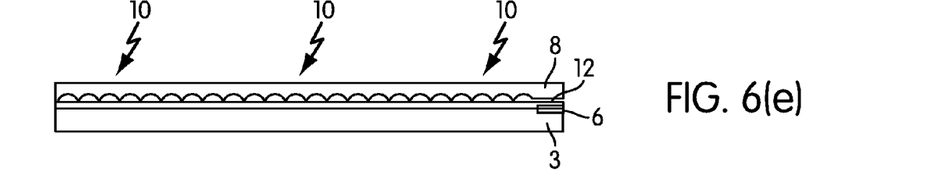
Figures 6F, 6G:
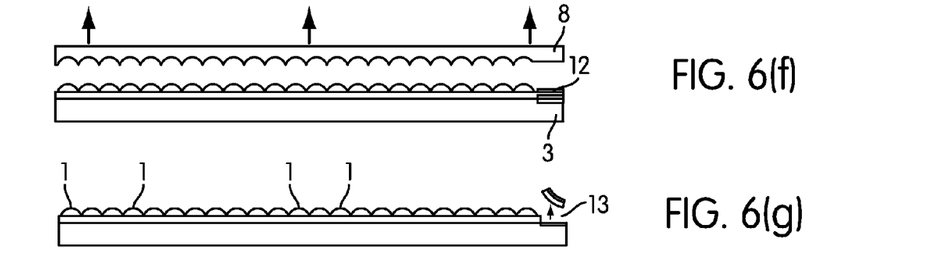

The method can comprise the following steps:

Step 1—FIG. 6(b): coating or otherwise dispensing a phosphor layer 12 over the entire LED wafer 3;

Step 2—FIG. 6(c): coating or otherwise dispensing a transparent lens material 7 onto the phosphor layer 12; the transparent lens material in one embodiment being a silicone, epoxy, polymer, plastic material, glass, or mixtures thereof;

Step 3—FIGS. 6(d) and 6(e): applying a stamp 8 having a pattern designed to mold the lenses from the transparent lens material to the transparent lens material 7 to conform the material to the shape of the stamp 8. In the embodiment illustrated there is one lens corresponding to each LED die of the LED wafer. The stamp 8 is also configured to provide an electrode window pattern 9 to allow subsequent electrical access to the one or more electrodes 6 of the LED array;

Step 4—FIG. 5(e): exposing the lens material to UV radiation 10 or thermal heat treatment to cure the patterned lens array and electrode window (this step is optional and depends upon the lens material being used);

Step 5—FIG. 5(f): removing the stamp 8; and

Figure 6H:
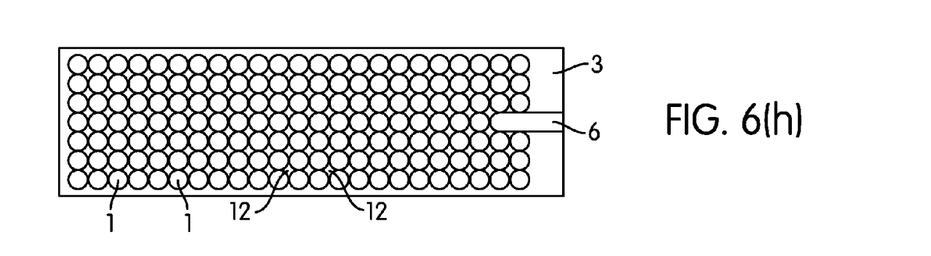

Step 6—FIG. 5(g): optionally exposing selected regions of the transparent material to an etch, such as an oxygen plasma or wet etch, to ash residual silicon, phosphor or epoxy lens material, and/or to provide electrical access to the electrodes 6 to power and control the LEDs. FIG. 6(h) is a plan view illustrating the completed LED lens assembly.

In one of many possible variations of the latter method outlined above, this variation being illustrated in FIG. 6, a release agent 11 is deposited onto the electrode region 6 of the LED wafer prior to the deposition of the phosphor coating FIG. 6(a). Then, after the stamp 8 has been removed in step 5, a lift-off step procedure 13, FIG. 6(g), may be performed in which appropriate processing of the release agent (e.g., such as dissolution) causes the transparent lens material overlying the electrode to be removed. Since the release agent is deposited only on the region covering the LED wafer electrode(s), the only lens material that is removed during the lift-off step is the lens material covering the electrode.

Alternative Phosphor Arrangements

Alternative ways to configure the phosphor in association with the LED lens devices (individual assemblies, and matched patterns of arrays) are illustrated in FIGS. 7 and 8. in the configurations shown in FIGS. 7(a) to 7(d) the phosphor 14 is embedded in a transparent matrix material (such as an epoxy) and the LED lens assembly 2, 1, and/or the matched lens array and LED array 5, 2, is itself embedded in and surrounded by the phosphor/matrix material 14 within a housing 15. Thus, with the configurations illustrated in FIGS. 7(a) to 7(d), light from the LEDs 2 is focused and/or intensified by its attendant lens 1 before entering the phosphor-impregnated epoxy or silicon material 14, where it 1) excites the phosphor, and 2) combines with the light generated by the phosphor to make the final product light.

Alternatively, for the cases shown in FIGS. 8(a) to 8(d) where the phosphor is disposed as a layer 12 between the LED 2 and the lens 1/lenslet array 5 (i.e., within the LED lens assembly). Light from the LED 2 first excites the phosphor 12 generating a second wavelength of light, the light from the LED and the light from the phosphor then being focused and intensified as a combined entity by the lens 1/lenslets 5.

Figure 7A:
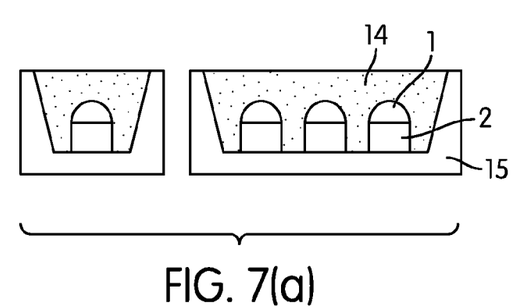
FIGS. 7(a) to 7(d) are schematic representations of light emitting devices in accordance with the invention.
Figure 7B:
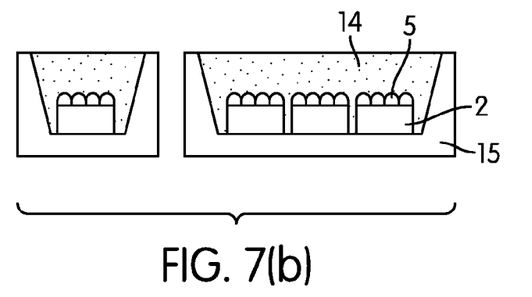
Figure 7C:
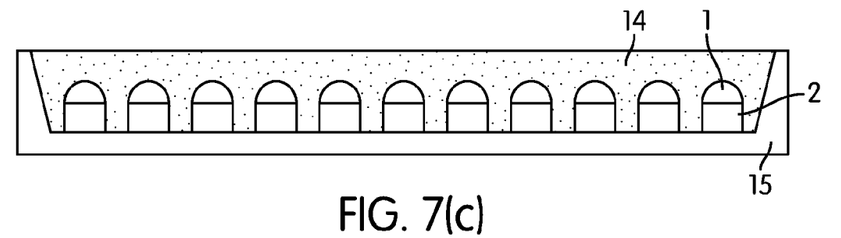
Figure 7D:
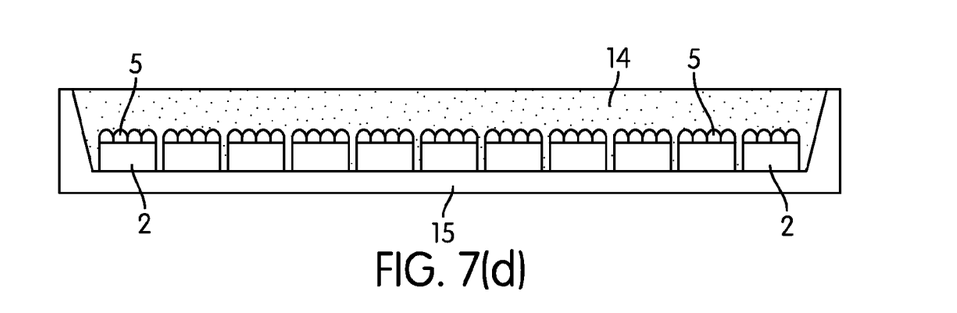
Figure 8A:
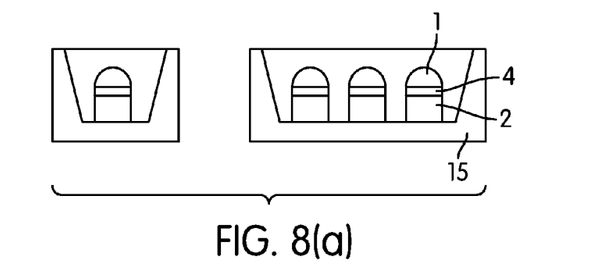
FIG. 8(a) to 8(d) are schematic representations of light emitting devices in accordance with the invention.

Regardless of the manner in which the phosphor is configured (i.e. using the principle of FIG. 7 or the principle of FIG. 8) the different ways in which to configure LED lens assemblies, and arrays of LEDs and arrays of lenses, can be the same. In other words, a single LED may be packaged with a single LED, as shown in FIGS. 7(a) and 8(a). There can be either one LED lens assembly per package, as shown on the left hand sides of FIGS. 7(a) and 8(a), or more than one assembly (for example, three assemblies), as shown in the right hand sides of FIGS. 7(a) and 8(a). In these embodiments a packaged LED comprises at least one lens. In another embodiment a packaged LED comprises at least one lens on a LED chip and luminescent phosphor contained either as an encapsulated material or as a coated film.

Figure 8B:
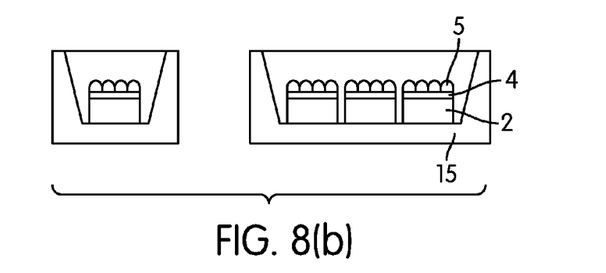
Figure 8C:
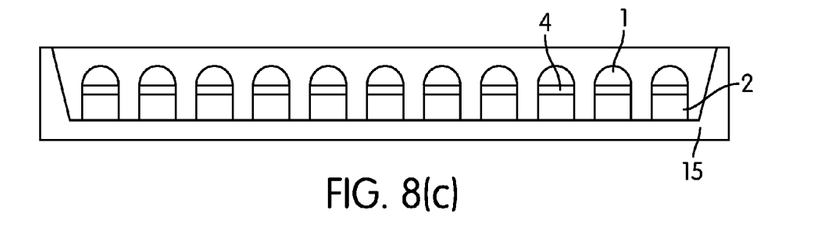
Figure 8D:
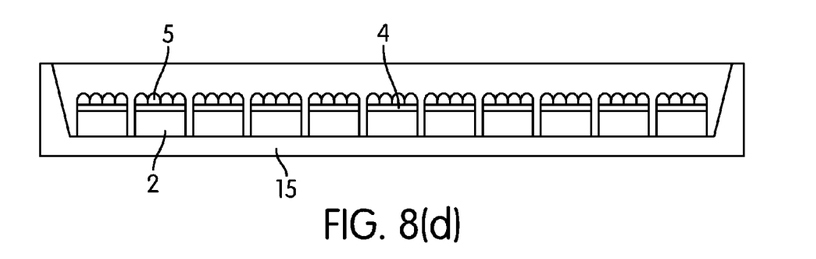

In an alternative arrangement of packaging, again applicable to any type of phosphor configuration, an array of mini lenslets may be provided on a single LED chip. This arrangement is shown in FIGS. 7(b) and 8(b). Referring to FIG. 7(b), left hand side, a single array of mini lenslets 5 paired with a single LED chip is packaged together; the array of mini lenslets appears as four rows (or columns) in cross-section. There may be a number of such units enclosed in a single package, such as three units on the right hand side of FIG. 7(b). Again, the arrangement shown for a luminescent phosphor encapsulated in a transparent matrix that surrounds the LED lens structure(s) is shown in FIG. 7(b), and a similar arrangement for the case where the luminescent phosphor is coated in a layer between the LED chip(s) and the lens(es) is shown in FIG. 8(b). In a plan view, the arrays depicted in FIGS. 7(b) and 8(b) may be square in shape, meaning that the number of array members in a row is equal to the number of array members in a column. The array may also be rectangular in shape, with the number of array members in a row greater than or less than the number of array members in a column. The array may be linear; that is to say, only one row in the package, and a multiple number of LED lens assemblies in the row (e.g., multiple column members). This configuration may be called a "bar" package. The units in this case may comprise a single lens paired with a single LED, as illustrated in FIG. 7(c) for an encapsulated phosphor and FIG. 8(c) for a phosphor coating, or multiple lenslets associated with a single LED, as in illustrated in FIG. 7(d) for an encapsulated phosphor and FIG. 8(d) for a phosphor coating.

What is claimed is:

1. An LED assembly comprising: an LED chip and a lens disposed adjacent to a light emitting surface of the LED chip; wherein the area of a cross-section of the lens is substantially equal to or less than the area of the LED chips light emitting surface.

2. The LED assembly of claim 1, and further comprising a phosphor encapsulated within a transparent material, the transparent material surrounding at least a portion of the light emitting surface of the LED chip.

3. The LED assembly of claim 1, and further comprising a phosphor layer disposed between the lens and at least a portion of the LED chips light emitting surface.

4. An LED assembly comprising: at least two lenses disposed adjacent to a light emitting surface of an LED chip; wherein the sum of the areas of the cross-sections of the at least two lenses is substantially equal to or less than the area of the LED chips light emitting surface.

5. The LED assembly of claim 4, and further comprising a phosphor encapsulated within a transparent material, the transparent material surrounding at least a portion of the light emitting surface of the LED chip.

6. The LED assembly of claim 4, and further comprising a phosphor layer disposed between the at least two lenses and at least a portion of the LED chips light emitting surface.

7. A light emitting device comprising: an array of LED chips and an array of lenses, wherein there is at least one lens associated with each LED chip of the array and wherein the area of a cross-section of each lens is substantially equal to or less than the area of the associated LED chips light emitting surface.

8. The light emitting device of claim 7, and further comprising a phosphor encapsulated within a transparent material, the transparent material surrounding at least a portion of the lens array.

9. The light emitting device of claim 7, and further comprising a phosphor layer disposed between at least one of the lenses of the lens array and at least one of the LED chips of the LED array.

10. A photonic device comprising: an LED chip configured to emit radiation at a first wavelength from a light emitting surface; a lens configured to optically focus radiation from the LED chip; a phosphor positioned adjacent to the LED chip, the phosphor configured to absorb at least a portion of the radiation emitted by the LED chip and emit radiation at a second wavelength, wherein the area of a cross-section of the lens is substantially equal to or less than the area of the LED chips light emitting surface.

11. The photonic device of claim 10, wherein the phosphor is encapsulated within a transparent material, the transparent material surrounding at least a portion of a light emitting surface of the LED chip.

12. The photonic device of claim 11, wherein the phosphor is disposed as a layer between the lens and at least a portion of the LED chips light emitting surface.

13. A method of fabricating an LED assembly, the method comprising: a) dispensing a transparent lens material onto a substrate containing an LED chip array; and b) molding the transparent lens material into a desired pattern of lenses to match the pattern of the LED chip array.

14. The LED assembly of claim 4, wherein each lens has dimensions in a range ~10 nm to 100 µm.

15. The method of claim 13, and comprising molding the lens material into the pattern of lenses by stamping the lens material with a stamp.

16. The method of claim 15, and further comprising, prior to removing the stamp, at least partially curing the lens material.

17. The method of claim 16, wherein the lens material is ultra violet curable and the stamp is substantially transparent to ultra violet radiation and comprising at least partially curing the lens material by irradiating the lens material through the stamp with ultra violet radiation.

18. The method of claim 15, wherein the lens material is thermally curable and comprising at least partially curing the lens material by heat treating the lens material.

19. The method of claim 15, wherein the stamp is configured such as to form windows in the lens material for providing electrical access to electrodes of the LED chip array.

20. The method of claim 19, and further comprising removing residual lens material from the electrodes by a process selected from the group consisting of: etching, oxygen plasma etching and wet etching.

21. The method of claim 19, and further comprising, prior to depositing the lens material, providing a release agent substantially overlying the electrodes.

22. The method of claim 21, and further comprising processing the release agent and removing lens material from the electrodes using a lift-off process.

23. The method of claim 13, and further comprising, prior to dispensing the lens material on the LED chip array, depositing a phosphor layer over substantially the entire surface of the LED chip array.

24. The method of claim 23, wherein the stamp is configured such as to form windows in the lens material and phosphor for providing electrical access to electrodes of the LED chip array.

25. The method of claim 24, and further comprising removing residual lens material and phosphor from the electrodes by a process selected from the group consisting of: etching, oxygen plasma etching and wet etching.

26. The method of claim 24, and further comprising, prior to depositing the phosphor, providing a release agent overlying the electrodes.

27. The method of claim 26, and further comprising processing the release agent and removing lens material and phosphor from the electrodes using a lift-off process.

28. The method of claim 13, and comprising, prior to dispensing the lens material, depositing a phosphor layer over substantially the entire surface of the LED chip array and patterning the phosphor so as to leave windows in the phosphor for providing electrical access to electrodes of the LED chip array.

29. A method of fabricating an LED assembly, the method comprising: a) dispensing a phosphor layer over substantially an entire surface of a substrate containing an LED chip array; and b) patterning the phosphor such as to leave windows in the phosphor for providing electrical access to electrodes of the LED chip array.

30. The method according to claim 29, and comprising patterning the phosphor by stamping the phosphor with a stamp configured such as to form the windows.

31. The method of claim 30, and further comprising removing residual phosphor from the electrodes by a process selected from the group consisting of: etching, oxygen plasma etching and wet etching.

32. The method of claim 30, and further comprising, prior to depositing the phosphor, providing a release agent substantially overlying the electrodes.

33. The method of claim 32, and further comprising processing the release agent and removing phosphor from the electrodes using a lift-off process.

34. The method according to claim 28, and further comprising dispensing a transparent lens material onto the substrate and molding the transparent lens material into a desired pattern of lenses to match the pattern of the LED chip array.

* * * * *